(12) United States Patent
Sasaki

(10) Patent No.: US 6,917,390 B2
(45) Date of Patent: Jul. 12, 2005

(54) INTERMEDIATE-FREQUENCY COUPLED-CIRCUIT FOR TELEVISION TUNER

(75) Inventor: Michinori Sasaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 545 days.

(21) Appl. No.: 10/103,425

(22) Filed: Mar. 21, 2002

(65) Prior Publication Data

US 2002/0135704 A1 Sep. 26, 2002

(30) Foreign Application Priority Data

Mar. 22, 2001 (JP) .................................... 2001-083208

(51) Int. Cl.[7] .................................................. H04N 5/50
(52) U.S. Cl. ..................................... 348/731; 348/733
(58) Field of Search ................................ 348/725, 731, 348/732, 733, 736, 737; 455/182.3, 182.1, 192.1, 192.3; H04N 5/44, 5/50

(56) References Cited

U.S. PATENT DOCUMENTS 4,271,433 A * 6/1981 Theriault .................... 348/731
4,835,608 A * 5/1989 Lachiw et al. ............... 348/733

FOREIGN PATENT DOCUMENTS

| DE | 35 14 678 | 10/1986 |
| EP | 0 933 932 | 8/1999 |
| JP | 5-048989 | 2/1993 |
| JP | 2000-152107 | 5/2000 |

* cited by examiner

Primary Examiner—Sherrie Hsia
(74) Attorney, Agent, or Firm—Brinks Hofer Gilson & Lione

(57) ABSTRACT

An intermediate-frequency (IF) coupled-circuit for a television tuner is provided, which is connected between an IF amplifying stage and a video-signal-selection filter, and which comprises a parallel circuit having a second capacitor connected in parallel to a series circuit having a resistor for impedance matching, an inductor, and a first capacitor which are connected in series, wherein the series circuit resonates at the frequency component of the selected channel, and the parallel circuit resonates at the frequency component of the channel lower than and adjacent to the selected channel, thereby functioning as a trap for removing the frequency component of the channel lower than and adjacent to the selected channel.

3 Claims, 4 Drawing Sheets

INTERMEDIATE-FREQUENCY COUPLED-CIRCUIT FOR TELEVISION TUNER

BACKGROUND OF THE INVENTION

1. Field of the Invention

The present invention generally relates to an intermediate-frequency coupled circuit for a television tuner (hereinafter referred to as an IF coupled-circuit), and particularly relates to an IF coupled-circuit in which there is no inductor between itself and a video-signal-selection filter connected thereto, and which has an impedance-matching function and a trapping function for removing an adjacent-channel frequency component.

2. Description of the Related Art

Hitherto, known television tuners which are used in the PAL (Phase Alternating by Line) system adopted in Europe etc. as the color television standard comprise an intermediate-frequency amplifying stage (hereinafter referred to as the IF amplifying stage), a video-signal-selection filter, and an IF coupled-circuit. The IF coupled-circuit is disposed between the IF amplifying stage and the video-signal-selection filter, for removing the frequency component of a channel lower than and adjacent to a selected receiving channel. The IF coupled-circuit may comprise an M-derived trap circuit having a parallel circuit wherein an inductor and a capacitor are connected in parallel, or may comprise a bridged-T trap circuit, for removing the frequency component of the channel lower than and adjacent to the selected channel.

FIG. 3 shows a first exemplary configuration of a television tuner comprising the above-described IF coupled-circuit. This IF coupled-circuit comprises an M-derived trap circuit therein.

This television tuner shown in FIG. 3 comprises an IF coupled-circuit (IF coupled part) 31, a radio-frequency amplifying stage (RFAMP) 32 (hereinafter referred to as the RF amplifying stage 32), a radio-frequency mixing stage (MIX) 33 (hereinafter referred to as the RF mixing stage 33), an intermediate-frequency tuning stage (IF tuner) 34 (hereinafter referred to as the IF tuning stage 34), an intermediate-frequency amplifying stage (IFAMP) 35 (hereinafter referred to as the IF amplifying stage 35), a surface-acoustic-wave filter (SAW) 36 (hereinafter referred to as the SAW filter 36) functioning as a video-signal-selection filter, a receiving antenna 37 (hereinafter referred to as the antenna 37), a video-signal output terminal 38, and an intermediate-frequency-signal output terminal cum intermediate-frequency testing terminal 39 (thereinafter referred to as the IF testing terminal 39).

The IF coupled-circuit 31 comprises a first inductor $31_1$, a first capacitor $31_2$, a second capacitor $31_3$, and a second inductor $31_4$. The first inductor $31_1$ and the first capacitor $31_2$ form a trap circuit for removing the frequency component of a channel lower than and adjacent to the selected channel. The second inductor $31_4$ is provided for matching the impedances of the IF testing terminal 39 and the SAW filter 36.

The input terminal of the RF amplifying stage 32 is connected to the antenna 37, and the output terminal thereof is connected to the input terminal of the RF mixing stage 33. The output terminal of the RF mixing stage 33 is connected to the input terminal of the IF tuning stage 34. The output terminal of the IF tuning stage 34 is connected to the input terminal of the IF amplifying stage 35. The output terminal of the IF amplifying stage 35 is connected to the input terminal of the IF coupled-circuit 31. The output terminal of the IF coupled-circuit 31 is connected to the input terminal of the SAW filter 36, and the output terminal of the SAW filter 36 is connected to the video-signal output terminal 38.

One end of each of the first inductor $31_1$ and the first capacitor $31_2$ is connected to the input terminal of the IF coupled-circuit 31, and the other ends thereof are connected to one end of the second capacitor $31_3$ and to the IF testing terminal 39. One end of the second inductor $31_4$ is connected to the one end of the second capacitor $31_3$ and to the IF testing terminal 39, and the other end thereof is connected to the output terminal of the IF coupled-circuit 31. The other end of the second capacitor $31_3$ is connected to ground.

The operation of the above-described television tuner will now be briefly described.

When the antenna 37 receives TV waves, the antenna 37 transmits the received waves to the RF amplifying stage 32 as a radio-frequency signal (hereinafter referred to as the RF signal). The RF amplifying stage 32 amplifies the RF signal to a predetermined level, and transmits the RF signal to the RF mixing stage 33. The RF mixing stage 33 mixes the RF signal with a local-oscillation signal to form a mixed-frequency signal, and transmits the mixed-frequency signal to the IF amplifying stage 35. The IF amplifying stage 35 selects an IF signal from the transmitted mixed-frequency signal, amplifies the IF signal, and transmits the amplified IF signal to the IF coupled-circuit 31. Upon receiving the IF signal, the trap circuit in the IF coupled-circuit 31 traps and removes the frequency component of the channel lower than and adjacent to the selected channel. Subsequently, the IF signal is transmitted to the IF testing terminal 39, and is transmitted to the SAW filter 36 via the second inductor $31_4$. The SAW filter 36 extracts a video signal from the transmitted IF signal, and transmits the video signal to the video-signal output terminal 38.

FIG. 4 shows a second exemplary configuration of a television tuner comprising the above-described IF coupled-circuit. This IF coupled-circuit comprises a bridged-T trap circuit therein. This drawing shows only the IF coupled-circuit and the other nearby circuits. The circuits that have already been illustrated in FIG. 3 are designated by like reference numerals.

As shown in FIG. 4, this television tuner comprises an IF coupled-circuit (IF coupled part) 41, an intermediate-frequency amplifying stage (IFAMP) 35 (hereinafter referred to as the IF amplifying stage 35), a surface-acoustic-wave filter (SAW) 36 (hereinafter referred to as the SAW filter 36) functioning as a video-signal-selection filter, a video-signal output terminal 38, and an intermediate-frequency-signal output terminal cum intermediate-frequency testing terminal 39 (hereinafter referred to as the IF testing terminal 39). The other elements are not shown in this figure.

The IF coupled-circuit 41 comprises a first capacitor $41_1$, a second capacitor $41_2$, a third capacitor $41_3$, a resistor $41_4$, a first inductor $41_5$, and a second inductor $41_6$. The second capacitor $41_2$, the third capacitor $41_3$, the resistor $41_4$, and the first inductor $41_5$ form a trap circuit for removing the frequency component of the channel lower than and adjacent to the selected channel. The second inductor $41_6$ is provided for matching the impedances of the IF testing terminal 39 and the SAW filter 36.

One end of each of the first capacitor $41_1$, the second capacitor $41_2$, and the resistor $41_4$ are connected to the input terminal of the IF coupled-circuit 41 and to the IF testing terminal 39. The other end of the first capacitor $41_1$ is connected to ground. The other end of the second capacitor $41_2$ is connected to one end of the third capacitor $41_3$ and to one end of the first inductor $41_5$. The other end of the first inductor $41_5$ is connected to ground. The other ends of the resistor $41_4$ and the third capacitor $41_3$ are connected to one end of the second inductor $41_6$. The other end of the second inductor $41_6$ is connected to the output terminal of the IF coupled-circuit 41.

The operation of the above-described television tuner will now be briefly described. However, the operation of this television tuner is the same as in the case of the television tuner shown in FIG. 3 except for the operation performed in the IF coupled-circuit 41. Therefore, only the operation performed by the IF coupled-circuit 41 is described below.

When the IF coupled-circuit 41 receives an IF signal, the trap circuit traps and removes the frequency component of the channel lower than and adjacent to the selected channel from the IF signal. Subsequently, the IF signal is transmitted to the IF testing terminal 39, and is transmitted to the SAW filter 36 via the second inductor $41_6$. The SAW filter 36 extracts a video signal from the transmitted IF signal, and transmits the video signal to the video-signal output terminal 38.

The known IF coupled-circuit 31 and the known IF coupled-circuit 41 have many drawbacks, which are described below.

The IF coupled-circuits 31 and 41 must comprise the second inductor $31_4$ and the second inductor $41_6$, which are connected in series to the input terminal of the SAW filter 36, for matching the impedances of the output terminal of the IF amplifying stage 35 and of the input terminal of the SAW filter 36. Accordingly, the number of parts is increased.

The output terminal of the IF coupled-circuit 31 and the IF testing terminal 39 are connected to each other with a low impedance. Subsequently, there is an increased possibility that an integrated circuit (not shown) having the IF amplifying stage 35 therein will be destroyed by an electrostatic discharge (ESD) due to the low impedance.

In the IF coupled-circuit 31, the frequency component of the channel lower than and adjacent to the selected channel is trapped by the trap circuit. When the attenuation of such a frequency component is increased, the attenuation of a video carrier frequency component of the selected channel is also increased.

In the IF coupled-circuit 41, the frequency component of the channel lower than and adjacent to the selected channel is also trapped by the trap circuit. When the resistance of the resistor $41_4$ is increased to increase the attenuation of the trapped frequency component, the attenuation of the frequency component of the selected channel is also increased due to the increased resistance.

SUMMARY OF THE INVENTION

Accordingly, it is an object of the present invention to provide an IF coupled-circuit for a television tuner which prevents an increase in the attenuation of the frequency component of the selected channel, and which allows for increasing the attenuation of the frequency component of the channel lower than and adjacent to the selected channel by trapping.

According to an aspect of the present invention, there is provided an intermediate-frequency (IF) coupled-circuit connected between an intermediate-frequency amplifying stage and a video-signal-selection filter of a television tuner.

The IF coupled-circuit comprises a resistor for impedance matching and a parallel circuit comprising a series circuit having an inductor and a first capacitor, which are connected in series and a second capacitor connected in parallel thereto. The series circuit resonates at the frequency component of a selected channel. The parallel circuit resonates at a frequency component of a channel lower than and adjacent to the selected channel, thereby acting as a trap for removing the frequency component of the channel lower than and adjacent to the selected channel.

Preferably, the IF coupled-circuit further comprises an IF testing terminal provided between the IF amplifying stage and the IF coupled-circuit.

Preferably, the IF coupled-circuit further comprises an IF output-terminal between the IF coupled-circuit and the video-signal-selection filter.

Thus, the parallel circuit comprises the second capacitor connected in parallel to the series circuit having the inductor and the first capacitor. The series circuit extracts the IF-signal of the selected channel, and the parallel circuit which is formed by the inductance of the series circuit and by the capacitance of the second capacitor traps the frequency component of the channel lower than and adjacent to the selected-channel. Accordingly, the attenuation of the IF-signal of the selected channel is reduced, and the attenuation of the frequency component of the channel lower than and adjacent to the selected channel is increased by trapping. Further, the resistor for impedance matching is disposed for matching the impedances of the output terminal of the IF amplifying stage and the input terminal of the video-signal-selection filter.

DESCRIPTION OF THE PREFERRED EMBODIMENT

The embodiment of the present invention will now be described with reference to the drawings.

Figure 1:
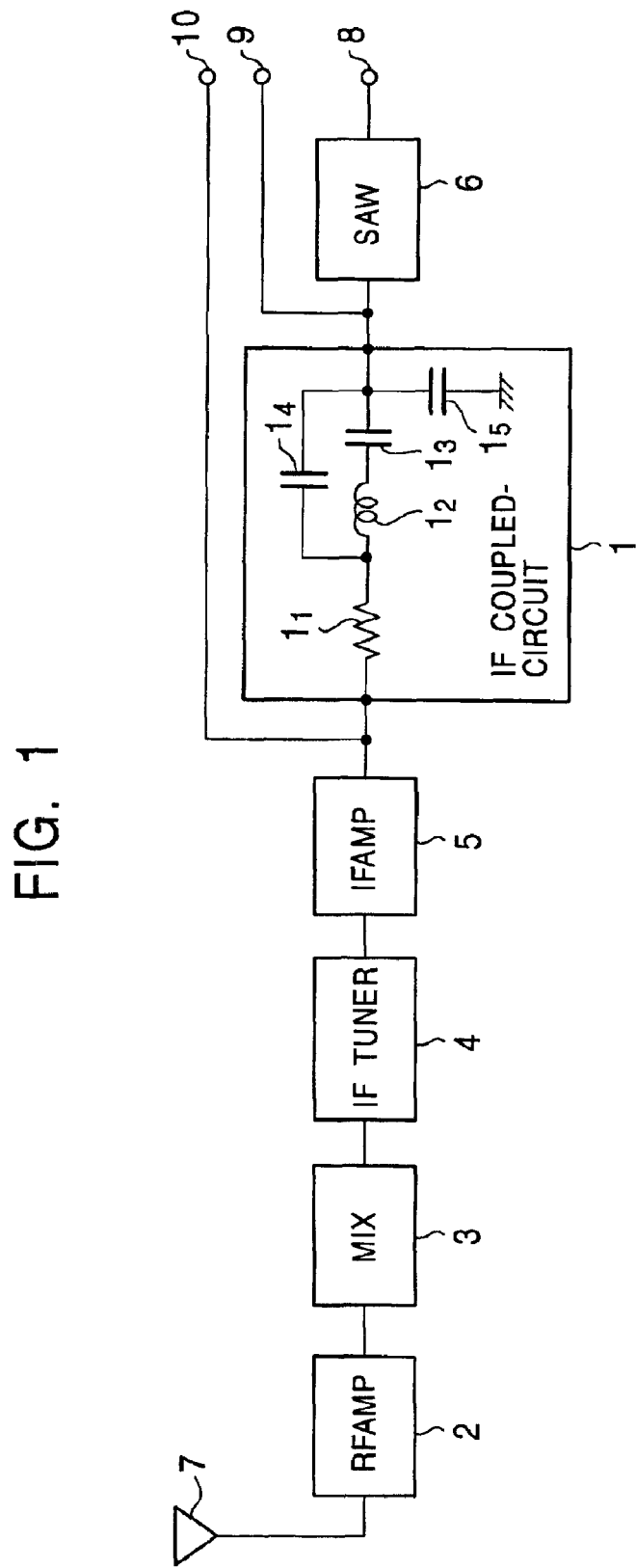
FIG. 1 shows an IF coupled-circuit for a television tuner according to an embodiment of the present invention for illustrating the configuration of a television tuner comprising the IF coupled-circuit.

FIG. 1 illustrates an intermediate-frequency coupled-circuit for a television tuner (hereinafter referred to as the IF coupled-circuit) according to the embodiment of the present invention, and the configuration of a television tuner comprising the IF coupled-circuit.

As shown in FIG. 1, this television tuner comprises the IF coupled-circuit (IF coupled-part) 1, a radio-frequency amplifying stage (RFAMP) 2 (hereinafter referred to as the RF amplifying stage 2), a radio-frequency mixer stage (MIX) 3 (hereinafter referred to as the RF mixer stage 3), an intermediate-frequency tuning stage (IF tuner) 4 (hereinafter referred to as the IF tuning stage 4), an intermediate-frequency amplifying stage (IFAMP) 5 (hereinafter referred to as the IF amplifying stage 5), a surface-acoustic-wave filter (SAW) 6 (hereinafter referred to as the SAW filter 6) that forms a video-signal-selection filter, a receiving antenna 7 (hereinafter referred to as the antenna 7), a video-signal output terminal 8, an intermediate-frequency-signal output terminal 9 (hereinafter referred to as the IF-signal output terminal 9), and an intermediate-frequency testing terminal 10 (hereinafter referred to as the IF testing terminal 10).

The IF coupled-circuit 1 comprises a resistor $1_1$, an inductor $1_2$, a first capacitor $1_3$, a second capacitor $1_4$, and a third capacitor $1_5$. The inductor $1_2$ and the first capacitor $1_3$ form a series circuit. The inductance and the capacitance thereof are set so that the series circuit resonates the intermediate frequency component of the selected channel. Further, the inductance of the series circuit and the capacitance of the second capacitor $1_4$ are set so that the series circuit and the second capacitor $1_4$ function as a trap by resonating at the frequency component of the channel lower than and adjacent to the selected-channel. The resistance of the resistor $1_1$ is set so that the impedance of the output terminal of the IF amplifying stage 5 matches the impedance of the input terminal of the SAW filter 6.

The input terminal of the RF amplifying stage 2 is connected to the antenna 7, and the output terminal thereof is connected to the input terminal of the RF mixer stage 3. The output terminal of the RF mixer stage 3 is connected to the input terminal of the IF tuning stage 4. The output terminal of the IF tuning stage 4 is connected to the input terminal of the IF amplifying stage 5. The output terminal of the IF amplifying stage 5 is connected to the input terminal of the IF coupled-circuit 1 and to the IF testing terminal 10. The input terminal of the SAW filter 6 is connected to the output terminal of the IF coupled-circuit 1 and to the IF-signal output terminal 9, and the output terminal thereof is connected to the video-signal output terminal 8.

One end of the resistor $1_1$ is connected to the input terminal of the IF coupled-circuit 1, and the other is connected to one end of the inductor $1_2$ and to one end of the second capacitor $1_4$. The other end of the inductor $1_2$ is connected to one end of the first capacitor $1_3$. The other end of the first capacitor $1_3$ and the other end of the second capacitor $1_4$ are connected to one end of the third capacitor $1_5$ and to the output terminal of the IF coupled-circuit 1. The other end of the third capacitor $1_5$ is connected to ground.

The operation of the television tuner will now be briefly described.

When the antenna 7 receives TV waves, the TV waves are transmitted to the RF amplifying stage 2 as a radio-frequency signal (hereinafter referred to as the RF signal). The RF signal is amplified to a predetermined level and is transmitted to the RF mixing stage 3. The RF mixing stage 3 mixes the RF signal with a local oscillation signal to form a mixed-frequency signal, and transmits the mixed-frequency signal to the IF amplifying stage 5. The IF amplifying stage 5 selects an intermediate-frequency signal (hereinafter referred to as the IF signal) from the transmitted mixed-frequency signal, and amplifies it. The amplified IF signal is transmitted to the input terminal of the IF coupled-circuit 1.

Upon receiving the amplified IF signal, the series circuit comprising the inductor $1_2$ and the first capacitor $1_3$ resonate at the intermediate frequency component of the selected channel. As a result, the intermediate frequency component of the selected channel in the IF signal is hardly attenuated and is transmitted to the output terminal of the IF coupled-circuit. The series circuit that generates an inductance and the second capacitor $1_4$ that generates a capacitance function as a parallel resonant circuit. By using this parallel resonant circuit, the frequency component of the channel lower than and adjacent to the selected channel in the IF signal is heavily attenuated and is transmitted to the output terminal of the IF coupled-circuit 1. Thus, the series circuit reduces the attenuation of the intermediate frequency component of the selected channel, and the parallel resonant circuit traps and attenuates the frequency component of the channel lower than and adjacent to the selected-channel.

The resistor $1_1$ matches the impedances of the output terminal of the IF amplifying stage 5 and of the input terminal of the SAW filter 6. The IF signal output from the IF coupled-circuit 1 is directly transmitted to the IF-signal output terminal 9 and is transmitted to the SAW filter 6. The SAW filter 6 extracts a video-signal from the IF signal and transmits the video-signal to the video-signal output terminal 8.

Figure 2:
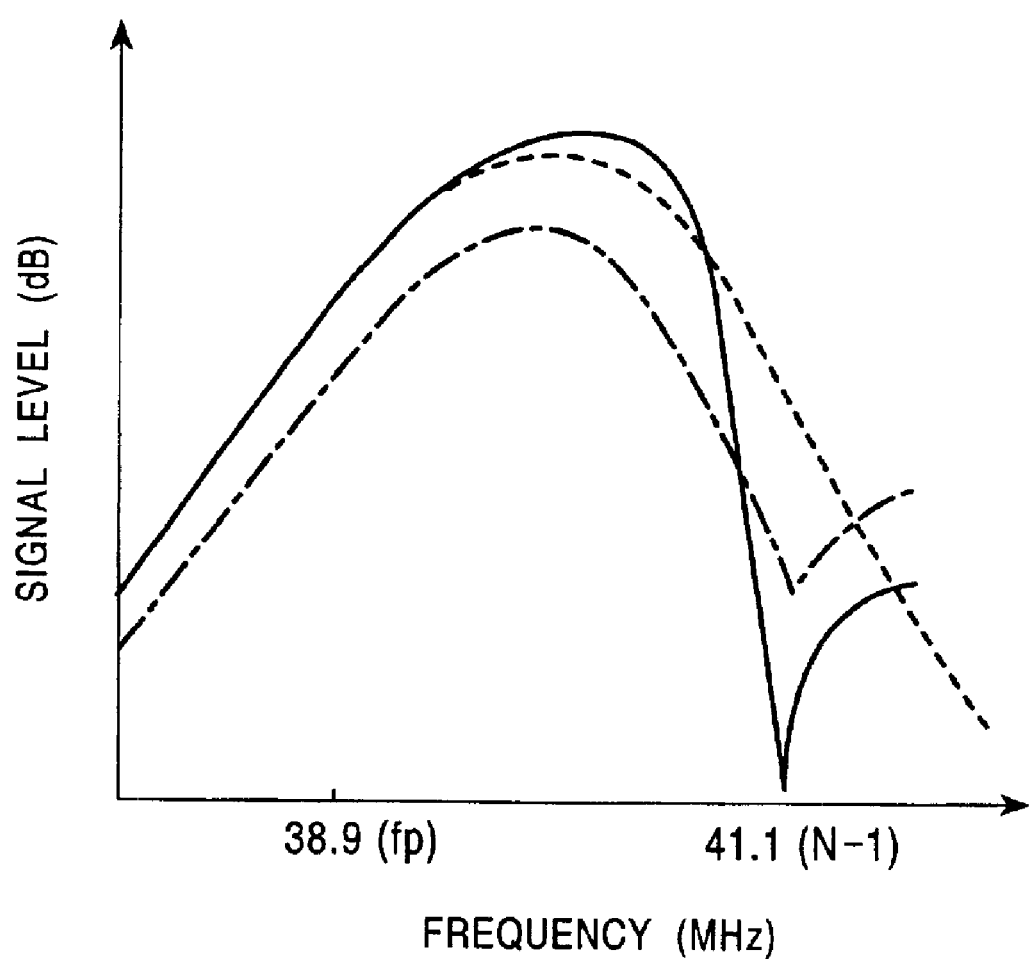
FIG. 2 shows an exemplary frequency-transmission characteristic of the IF coupled-circuit shown in FIG. 1.
Figure 3:
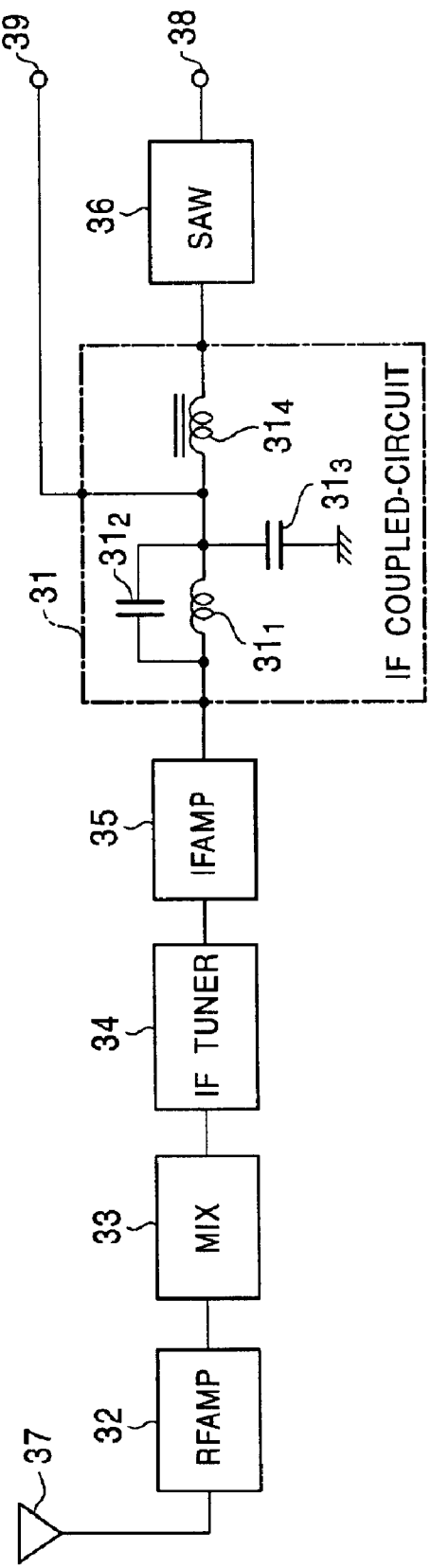
FIG. 3 shows a first exemplary configuration of a television tuner comprising a known IF coupled-circuit.
Figure 4:
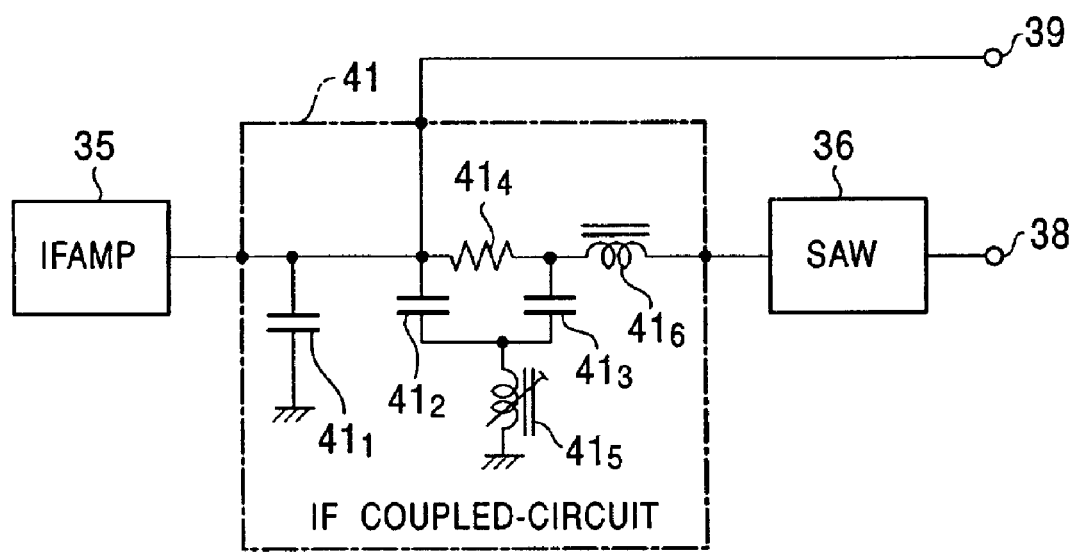
FIG. 4 shows a second exemplary configuration of another television tuner comprising another known IF coupled-circuit.

FIG. 2 illustrates an exemplary frequency-transmission characteristic of the IF coupled-circuit 1 shown in FIG. 1, which is shown by the solid line. In this drawing, the frequency-transmission characteristic of the IF coupled-circuit 31 shown in FIG. 3, which is shown by the chain line, and that of a given IF coupled-circuit without a trap, which is shown by the dotted line, are also illustrated for comparison purposes.

The horizontal axis shows the frequency in megahertz (MHz) and the vertical axis shows the signal level in decibels (dB).

The frequency-transmission characteristic of the IF coupled-circuit without a trap, which is shown by the dotted line, will now be described. In this case, the attenuation of the frequency component of the selected channel (video carrier frequency of 38.9 MHz) is comparatively small. However, since this IF coupled-circuit has no trap, the frequency component of the channel lower than and adjacent to the selected channel (41.4 MHz) is hardly attenuated.

The frequency-transmission characteristic of the IF coupled-circuit 31, which is shown by the chain line, will now be described. In this case, the attenuation of the frequency component of the channel lower than and adjacent to the selected-channel (41.4 MHz) is slightly increased because of the trap. However, since the attenuation of the frequency component of the selected channel (video carrier frequency of 38.9 MHz) is increased, the signal loss in the IF coupled-circuit 31 increases.

The frequency-transmission characteristic of the IF coupled-circuit 1, which is shown by the solid line, will now be described. In this case, not only does the attenuation of the frequency component of the selected channel (video carrier frequency of 38.9 MHz) become comparatively small but also the attenuation of the frequency component of the channel lower than and adjacent to the selected channel (41.4 MHz) becomes extremely large. Accordingly, the IF coupled-circuit 1 can achieve a suitable frequency-transmission characteristic.

What is claimed is:

1. An intermediate-frequency coupled-circuit connected between an intermediate-frequency amplifying stage and a video-signal-selection filter of a television tuner, comprising:
   a resistor to impedance match;
   a parallel circuit comprising a series circuit having an inductor and a first capacitor, which are connected in series, and a second capacitor connected in parallel thereto; and
   an intermediate-frequency testing terminal provided between the intermediate-frequency amplifying stage and the intermediate-frequency coupled-circuit, wherein the series circuit resonates at a frequency component of a selected channel, and the parallel circuit resonates at a frequency component of a channel lower than and adjacent to the selected channel, thereby acting as a trap to remove the frequency component of the channel lower than and adjacent to the selected channel.

2. An intermediate-frequency coupled-circuit for a television tuner according to claim 1, further comprising an intermediate-frequency output terminal between the intermediate-frequency coupled-circuit and the video-signal-selection filter.

3. An intermediate-frequency coupled-circuit connected between an intermediate-frequency amplifying stage and a video-signal-selection filter of a television tuner, comprising:

a resistor to impedance match;

a parallel circuit comprising a series circuit having an inductor and a first capacitor, which are connected in series, and a second capacitor connected in parallel thereto; and an intermediate-frequency output terminal between the intermediate-frequency coupled-circuit and the video-signal-selection filter, wherein the series circuit resonates at a frequency component of a selected channel, and the parallel circuit resonates at a frequency component of a channel lower than and adjacent to the selected channel, thereby acting as a trap to remove the frequency component of the channel lower than and adjacent to the selected channel.

* * * * *